United States Patent
Cheng

(10) Patent No.: US 10,035,895 B2
(45) Date of Patent: Jul. 31, 2018

(54) FORM-IN-PLACE CONDUCTIVE AND WATERPROOF COLLOID

(71) Applicants: TennVac Inc., New Taipei (TW); TennMax America Inc., Vancouver, WA (US)

(72) Inventor: Hsin-Pei Cheng, New Taipei (TW)

(73) Assignees: TennVac Inc., New Taipei (TW); TennMax America Inc., Vancouver, WA (US)

( * ) Notice: Subject to any disclaimer, the term of this patent is extended or adjusted under 35 U.S.C. 154(b) by 0 days.

(21) Appl. No.: 15/404,721

(22) Filed: Jan. 12, 2017

(65) Prior Publication Data

US 2018/0148562 A1 May 31, 2018

(30) Foreign Application Priority Data

Nov. 28, 2016 (CN) .......................... 2016 1 1065150

(51) Int. Cl.
| | |
|---|---|
| G21F 1/02 | (2006.01) |
| G21F 1/06 | (2006.01) |
| G21F 1/10 | (2006.01) |
| C08K 3/04 | (2006.01) |
| C08K 3/36 | (2006.01) |
| C08K 9/04 | (2006.01) |

(Continued)

(52) U.S. Cl.
CPC ................ *C08K 3/08* (2013.01); *C08G 77/04* (2013.01); *C08G 77/08* (2013.01); *C08K 3/04* (2013.01); *C08K 3/36* (2013.01); *C08K 9/04* (2013.01); *H05K 9/0092* (2013.01); *C08K 2003/0862* (2013.01); *C08K 2201/001* (2013.01)

(58) Field of Classification Search
None
See application file for complete search history.

(56) References Cited

U.S. PATENT DOCUMENTS 4,529,741 A * 7/1985 Bauman ................. C08J 9/0066
521/122
4,545,914 A * 10/1985 Graiver .................... C08K 7/04
252/502

(Continued)

*Primary Examiner* — Joseph D Anthony
(74) *Attorney, Agent, or Firm* — Juan Carlos A. Marquez; Marquez IP Law Office, PLLC

(57) ABSTRACT

The present invention discloses a form-in-place conductive and waterproof colloid, being composed of: dimethyl siloxane or dimethylvinyl-terminated or vinyl terminated polydimethylsiloxane; hydroxy terminated polydimethylsiloxane; dispersant; dimethyl, methylhydrogen siloxane crosslinking agent; adhesion promoter; Pt catalyst; forming agent; hydrocarbon solvent; Nickel Graphite; thickening agent; Trimethylated silica; and inhibitor. With the implementation of the present invention, no production mold or die cutter is required to simplify the process of applying the colloid and reduce the cost of applying, and with the characteristics of being providing waterproof and dustproof capability for enclosures, providing excellent adhesion capability, providing excellent compressibility and resilience, isolating EMI and providing EMI shielding capability at the same time. Besides, the space required is small when forming or applying making the colloid suitable for applications to small or mini devices and save the cost of material and cost of implementation.

9 Claims, 2 Drawing Sheets

(51) Int. Cl.
*C08K 3/08* (2006.01)
*C08G 77/04* (2006.01)
*C08G 77/08* (2006.01)
*H05K 9/00* (2006.01)

(56) References Cited

U.S. PATENT DOCUMENTS

| | | | |
|---|---|---|---|
| 6,902,689 B2 * | 6/2005 | Lake | C09J 5/06 |
| | | | 252/500 |
| 2003/0047718 A1 * | 3/2003 | Narayan | C08K 9/02 |
| | | | 252/500 |
| 2013/0012620 A1 * | 1/2013 | Dershem | C07D 233/61 |
| | | | 523/400 |
| 2015/0129276 A1 * | 5/2015 | Shumaker | H01B 1/22 |
| | | | 174/69 |

* cited by examiner

FORM-IN-PLACE CONDUCTIVE AND WATERPROOF COLLOID

BACKGROUND OF THE INVENTION

1. Technical Field

The present invention relates to waterproof colloid, and more particularly to a form-in-place conductive and waterproof colloid.

2. Description of Related Art

Electronic products are widely used and are almost a necessity in modern life. The product features, durability or the degree of harm to the human body of electronic products rely greatly on the packaging, gluing and its capability of isolating electromagnetic interference (EMI).

Except structures formed in one piece, the case of electronic products is mostly joined with colloid. However, the feature, characteristics or quality of colloid is so hard to manage or control that sometimes the function or even the compliance to regulations of the whole product fails.

What is more, electronic products themselves can be quite harmful and cause unnecessary damage to the human body when the colloid in the joint of the case fails to isolate or shield the existing electromagnetic interference (EMI).

It is therefore highly desirable to have the development of a waterproof, and dustproof colloid that is also capable of isolating and shielding EMI to apply in the production and wide application of electronic products to enhance the contribution to the quality of life of all mankind.

BRIEF SUMMARY OF THE INVENTION

The present invention discloses a form-in-place conductive and waterproof colloid, being composed of: dimethyl siloxane or dimethylvinyl-terminated or vinyl terminated polydimethylsiloxane; hydroxy terminated polydimethylsiloxane; dispersant; dimethyl, methylhydrogen siloxane crosslinking agent; adhesion promoter; Pt catalyst; forming agent; hydrocarbon solvent; Nickel Graphite; thickening agent; Trimethylated silica; and inhibitor. With the implementation of the present invention, no production mold or die cutter is required to simplify the process of applying the colloid and reduce the cost of applying, and with the characteristics of being providing waterproof and dustproof capability for enclosures, providing excellent adhesion capability, providing excellent compressibility and resilience, isolating EMI and providing EMI shielding capability at the same time. Besides, the space required is small when forming or applying making the colloid suitable for applications to small or mini devices and save the cost of material and cost of implementation.

The present invention provides a form-in-place conductive and waterproof colloid, being composed of: 9%-12% of dimethyl siloxane or dimethylvinyl-terminated or vinyl terminated polydimethylsiloxane; 12%-15% of hydroxy terminated polydimethylsiloxane; 0%-0.2% of dispersant; 3%-5% of dimethyl, methylhydrogen siloxane crosslinking agent; 0%-0.2% of adhesion promoter; 0%-0.2% of Pt catalyst; 1%-3% of forming agent; 0%-10% of hydrocarbon solvent; 50%-70% of Nickel Graphite; 0%-0.2% of thickening agent; 5%-10% of Trimethylated silica; and 0%-0.1% of inhibitor.

Implementation of the present invention at least provides the following advantageous effects:

1. Production mold or die cutter is not required to simplify the process of applying the colloid and reduce the cost of applying.
2. Providing waterproof and dustproof capability for enclosures.
3. Excellent adhesion capability.
4. Excellent compressibility and resilience o
5. Isolating EMI and providing EMI shielding capability.
6. The space required is small when forming or applying making the colloid suitable for applications to small or mini devices and save the cost of material and cost of implementation.

The features and advantages of the present invention are detailed hereinafter with reference to the preferred embodiments. The detailed description is intended to enable a person skilled in the art to gain insight into the technical contents disclosed herein and implement the present invention accordingly. In particular, a person skilled in the art can easily understand the objects and advantages of the present invention by referring to the disclosure of the specification, the claims, and the accompanying drawings.

BRIEF DESCRIPTION OF THE SEVERAL VIEWS OF THE DRAWINGS

The invention as well as a preferred mode of use, further objectives and advantages thereof will be best understood by reference to the following detailed description of illustrative embodiments when read in conjunction with the accompanying drawing, wherein.

DETAILED DESCRIPTION OF THE INVENTION

Figure 1:
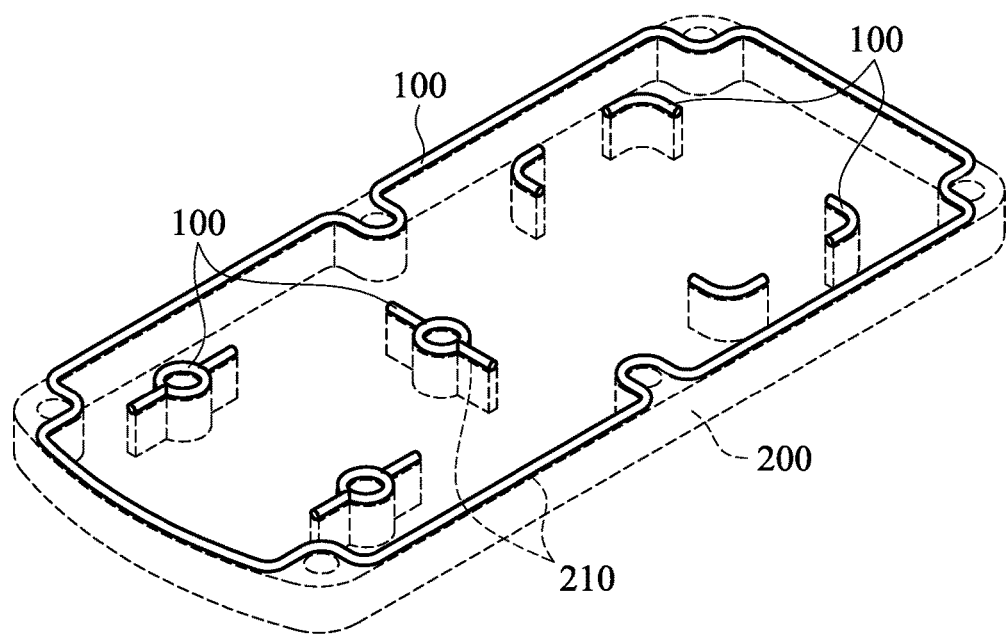
FIG. 1 is a structural perspective view of a form-in-place conductive and waterproof colloid formed or dispensed in an enclosure in an embodiment of the present invention.

Please refer to FIG. 1, an embodiment of a form-in-place conductive and waterproof colloid 100 composed of dimethyl siloxane or dimethylvinyl-terminated or vinyl terminated polydimethylsiloxane; hydroxy terminated polydimethylsiloxane; dispersant; dimethyl, methylhydrogen siloxane crosslinking agent; adhesion promoter; Pt catalyst; forming agent; hydrocarbon solvent; Nickel Graphite; thickening agent; Trimethylated silica; and inhibitor is being applied on an enclosure 200.

The composing weight percentage of the form-in-place conductive and waterproof colloid 100 is 9%-12% of dimethyl siloxane or dimethylvinyl-terminated or vinyl terminated polydimethylsiloxane; 12%-15% of hydroxy terminated polydimethylsiloxane; 0%-0.2% of dispersant; 3%-5% of dimethyl, methylhydrogen siloxane crosslinking agent; 0%-0.2% of adhesion promoter; 0%-0.2% of Pt catalyst; 1%-3% of forming agent; 0%-10% of hydrocarbon solvent; 50%-70% of Nickel Graphite; 0%-0.2% of thickening agent; 5%-10% of Trimethylated silica; and 0%-0.1% of inhibitor.

The said form-in-place conductive and waterproof colloid 100 possesses a special feature of being capable of being easily dispensed without having to use a production mold or a die cutter, which simplifies the process of applying the colloid and reduce the cost of applying.

Further, the form-in-place conductive and waterproof colloid 100 itself, being electrically conductive, is excellent in adhesion capability, compressibility and resilience, and is an excellent EMI shielding or isolating colloid.

The adhesion strength of the form-in-place conductive and waterproof colloid 100 can be made larger than 80N/cm2 in embodiments, and the EMI shielding capability is larger than 100 dB in the frequency spectrum range from 200 MHz to 20 GHz.

As shown in FIG. 1, in embodiments, at least one dispensing path 210 is formed on the enclosure 200 for dispensing the form-in-place conductive and waterproof colloid 100, and wherein the width of any of the dispensing path can be made in between 0.4 mm to 2 mm and the disclosure 200 can be a CNC made structure.

As for the length of each dispensing path 210, and thus the length of the form-in-place conductive and waterproof colloid 100, depends on the requirements of different applications.

While in embodiments, the width of the form-in-place conductive and waterproof colloid 100 can be made to be 4 mm or larger than 4 mm with a height of 0.3 mm or higher than 0.3 mm.

Moreover, the form-in-place conductive and waterproof colloid 100 can be dispensing applied on the enclosure 200 by an automatic filling machine.

Figure 2:
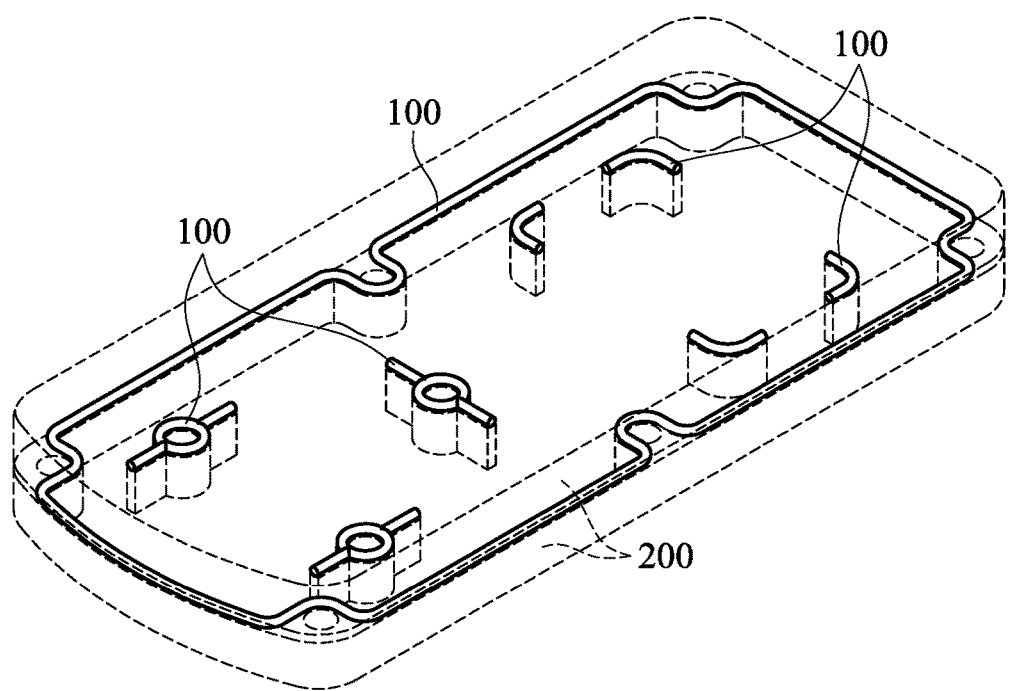
FIG. 2 is a structural perspective view of a form-in-place conductive and waterproof colloid formed or dispensed in a closed enclosure in an embodiment of the present invention.

As can be seen in FIG. 2, with the filling or dispensing of the form-in-place conductive and waterproof colloid 100, especially in every joints of the enclosure 200, water drops or debris can be prevented from entering the enclosure 200, EMI (Electro Magnetic Interference) from inside or outside the enclosure 200 can be blocked or isolated without leaking or penetration to make the whole enclosure 200 being in compliance with EMI regulations.

All in all, as shown in FIG. 1 and FIG. 2 and stated in the previous embodiments, with the form-in-place conductive and waterproof colloid 100 dispensed, the enclosure 200 can be with the characteristics of being providing waterproof and dustproof capability for enclosures, providing excellent adhesion capability, providing excellent compressibility and resilience, isolating EMI and providing EMI shielding capability at the same time.

Further with no production mold or die cutter is required for applying the form-in-place conductive and waterproof colloid 100, the process of applying the colloid is simplified and the cost of applying is reduced to make more applications in a variety of electronic products or equipments possible.

The embodiments described above are intended only to demonstrate the technical concept and features of the present invention so as to enable a person skilled in the art to understand and implement the contents disclosed herein. It is understood that the disclosed embodiments are not to limit the scope of the present invention. Therefore, all equivalent changes or modifications based on the concept of the present invention should be encompassed by the appended claims.

What is claimed is:

1. A form-in-place conductive and waterproof colloid, being composed of:
   9%-12% by weight of a siloxane selected from the group consisting of dimethyl siloxane, dimethylvinyl-terminated siloxane, vinyl terminated polydimethylsiloxane and mixtures thereof;
   12%-15% by weight of hydroxy terminated polydimethylsiloxane;
   0%-0.2% by weight of dispersant;
   3%-5% by weight of dimethyl methylhydrogen siloxane crosslinking agent;
   0%-0.2% by weight of adhesion promoter;
   0%-0.2% by weight of Pt catalyst;
   1%-3% by weight of forming agent;
   0%-10% by weight of hydrocarbon solvent;
   50%-70% by weight of Nickel Graphite;
   0%-0.2% by weight of thickening agent;
   5%-10% by weight of Trimethylated silica; and
   0%-0.1% by weight of inhibitor.

2. The form-in-place conductive and waterproof colloid of claim 1, being dispensed on an enclosure.

3. The form-in-place conductive and waterproof colloid of claim 2, being dispensing applied on the enclosure by an automatic filling machine.

4. The form-in-place conductive and waterproof colloid of claim 1, having an adhesion strength larger than 80N/cm2.

5. The form-in-place conductive and waterproof colloid of claim 1, having a shielding capability larger than 100 dB in the frequency spectrum range from 200 MHz to 20 GHz.

6. The form-in-place conductive and waterproof colloid of claim 1, is being electrically conductive.

7. The form-in-place conductive and waterproof colloid of claim 1, wherein the minimum width of it is 0.4 mm.

8. The form-in-place conductive and waterproof colloid of claim 2, wherein the minimum height of it on the enclosure is 0.3 mm.

9. The form-in-place conductive and waterproof colloid of claim 2, wherein at least one dispensing path formed on the enclosure, and wherein the width of any of the dispensing path is in between 0.4 mm to 2 mm.

* * * * *